United States Patent [19]

Donges

[11] Patent Number: 4,546,414
[45] Date of Patent: Oct. 8, 1985

[54] PLUG-IN CIRCUIT BOARD CONNECTOR AND KEYING ASSEMBLY

[75] Inventor: William E. Donges, Lorain, Ohio

[73] Assignee: Nordson Corporation, Amherst, Ohio

[21] Appl. No.: 482,281

[22] Filed: Apr. 12, 1983

[51] Int. Cl.[4] .............................................. H05K 1/14
[52] U.S. Cl. .............................. 361/413; 339/17 LM; 339/176 MP; 339/184 R
[58] Field of Search .............. 361/401, 413, 415, 391, 361/399, 400, 406; 339/176 MD, 186 M, 17 L, 17 LM, 184 R

[56] References Cited

U.S. PATENT DOCUMENTS

| | | | |
|---|---|---|---|
| 3,327,175 | 6/1967 | Binzenhofer | 317/101 |
| 3,368,117 | 2/1968 | Pond et al. | 317/101 |
| 3,634,816 | 1/1969 | Zell | 339/186 M |
| 3,733,523 | 5/1973 | Reynolds et al. | 317/101 DH |
| 3,767,974 | 10/1973 | Donovan, Jr. et al. | 317/101 DH |
| 3,818,280 | 6/1974 | Smith et al. | 317/101 DH |
| 3,848,953 | 11/1974 | Petroshanoff | 339/92 M |
| 4,179,724 | 12/1979 | Bonhomme | 361/391 |
| 4,307,927 | 12/1981 | Mollman | 339/186 M |
| 4,412,712 | 11/1983 | Reimer et al. | 339/17 M |
| 4,418,971 | 12/1983 | Liss | 339/17 L |

Primary Examiner—R. R. Kucia
Assistant Examiner—Tarick Basma
Attorney, Agent, or Firm—Wood, Herron & Evans

[57] ABSTRACT

A mainframe printed wiring board assembly for receiving plug-in circuit boards of two different types in connectors on the mainframe printed wiring board. Each connector is correct for only one of the two types of circuit board. The mainframe printed wiring board assembly includes a row of connectors of a first type and a row of connectors of a second type, with each connector in each row having an elongated slot adapted to receive a circuit board edge. The slots in the connectors in each row extend transversely to the direction of the row. A first elongated key element extends along the first row of connectors adjacent the connector ends. A second elongated key element extends along the second row of connectors, spaced apart from the connector ends. The two different types of plug-in circuit boards have, on their connector engaging edges, different contours to accommodate one or the other of the elongated key elements.

19 Claims, 4 Drawing Figures

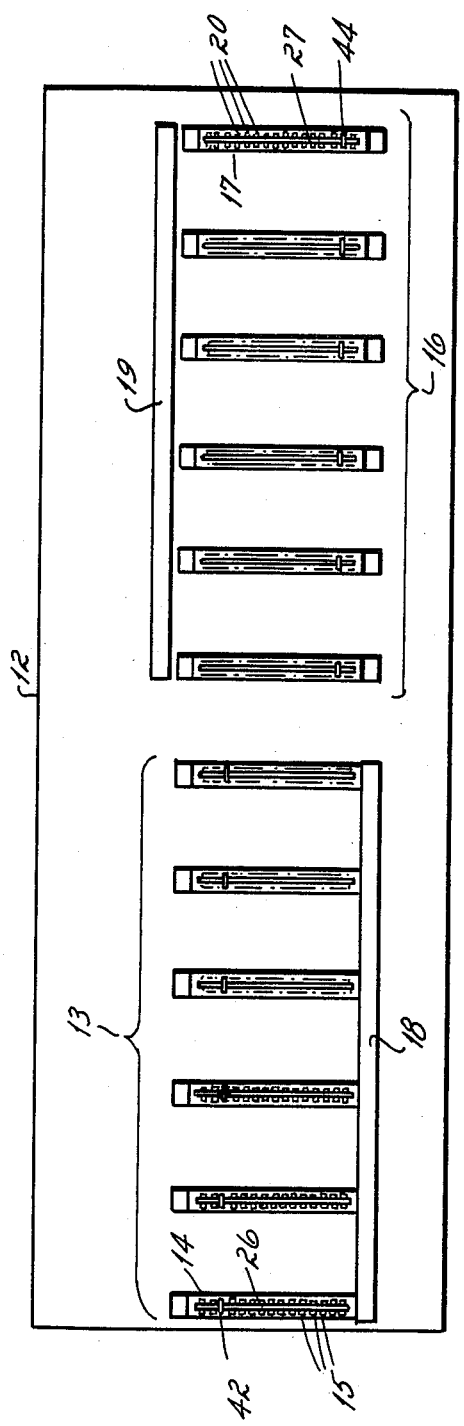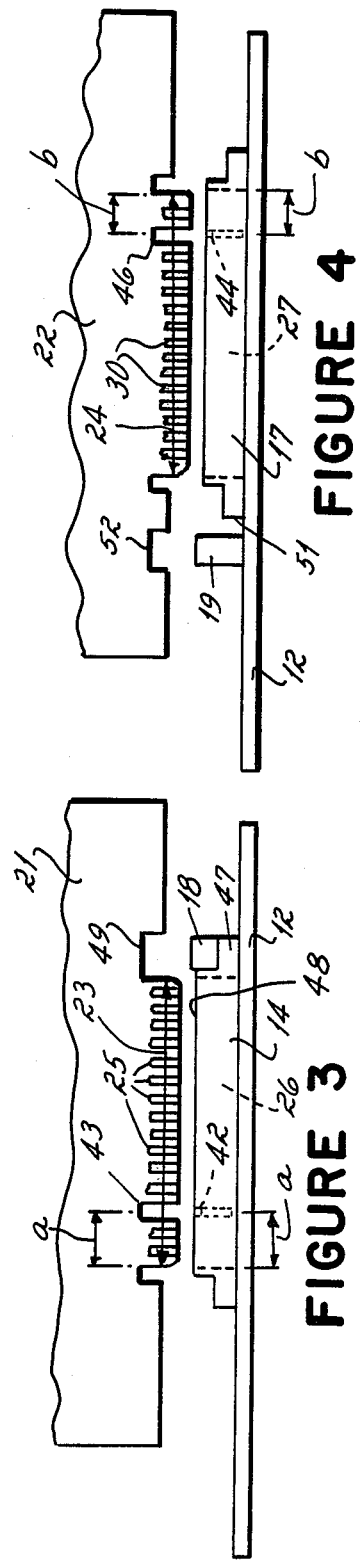

PLUG-IN CIRCUIT BOARD CONNECTOR AND KEYING ASSEMBLY

DESCRIPTION OF THE INVENTION

This invention relates generally to electrical connectors and more particularly concerns a printed wiring board edge connector and keying assembly on a main circuit board, or mainframe printed wiring board.

In making connections between electrical circuits which are spaced apart from one another, or between separate circuit boards in a single electronic apparatus, typically a number of individual conductors lead from one location to another completing the desired electrical paths. Often, these conductors are collected in a group and connected at their ends to a connector of some type. This connector is in turn coupled to a mating connector in one of the circuits in order to make the various electrical connections. Such connectors permit easier removal or replacement of subparts of an electronic circuit since the conductors are not soldered or otherwise secured to the circuit board.

One common type of electrical interconnection assembly employed is a mainframe printed wiring board, or main circuit board, upon which are located a number of printed wiring board edge connectors. Individual printed circuit boards are received in the edge connectors to form an interconnected electronic circuit or group of circuits. Conduction paths on the individual printed wiring boards terminate along a contoured edge of each board, which is received in an elongated slot in a connector on the mainframe printed wiring board. Each connector slot contains conductive contacts which engage corresponding conductive paths on the printed wiring board edge. The conductive electrical contacts in each connector are in turn electrically coupled to further circuitry through conductive paths and circuit elements on the mainframe printed wiring board.

Since circuit boards of many different types may be placed in connectors on a particular mainframe printed wiring board, various means have been devised to assure that a board may be placed only in a connector correct for that type of board. One technique for accomplishing this has been to vary the sizes of the connectors, or to vary the lengths of the board-receiving slots therein, so that it is clear which type of board should be placed in a particular type of connector.

In order to further guarantee proper circuit board placement, one or more projections or keys have been placed in each connector slot. Typically, these projections are located at unused contact locations along the connector slot. The positioning of the projections varies from connector to connector so that a particular projection placement is established for each connector. Each circuit board to be inserted in a connector carries notches in the edge of the board which is received in the connector. The notches in the edge of a board which is correct for a particular connector are located to receive the projections along the connector slot. In this way, ideally, only the correct board or boards may be placed in a particular connector.

It has been possible in the past, however, to defeat this type of keying system. For example, forcing the wrong type of board into a connector slot may wear down the projections, or keys, in the slot. Or, more likely, the unnotched portion of the circuit board edge, which carries the conductive paths which are received in the connector, can be broken or worn away sufficiently to create an identation to accommodate a key. In either of these cases, it is possible to force a circuit board into a connector with which the board is not compatible.

In many circuit arrangements, there is a need to positively prevent the insertion of a plug-in circuit board into an improper connector. For example, in certain safety circuits, the insertion of a circuit board in the wrong connector may totally defeat the safety function for which the circuit was designed. The consequences can be worse than mere damage to the circuitry. A danger may be posed to those relying upon the safety system, which has been rendered inoperative due to the erroneous placement of the circuit board.

For example, in one illustrative safety circuit arrangement, which shall be described in more detail hereinafter, two types of isolation safety circuit boards are employed. These boards provide isolation between a robot control and a robot by limiting the amount of electrical energy which can be coupled from the control to the robot. The robot may be operating in a dangerous, for example, flammable, environment.

AC isolation boards are interposed between ac electronic circuitry in the robot control system and the controlled robot. Similarly, isolation boards in a second group, dc isolation circuit boards, are interposed between dc circuitry in the control system and the robot. There are a number of circuit boards of each type, ac isolation boards and dc isolation boards, and it is imperative that each type of board is placed only in the correct connector for that type of circuit board. The electrical isolation required for safety is not provided if a dc isolation board is placed in an ac connector or if an ac isolation board is placed in a dc connector.

In the particular assembly to be discussed below, a mainframe printed wiring board carrying the ac and dc isolation plug-in circuit boards is also connected within a framework including two rigid sidewalls. Both the ac and dc plug-in boards are rectangular, and each carries a rigid crosspiece on the edge opposite that received in its associated connector. Each crosspiece is in turn fastened to the sidewalls of the frame so that the boards are not only plugged into the connectors but also secured therein when the crosspieces are fastened to the framework.

In this arrangment, it is particularly important that whatever provisions are made to mechanically prevent the insertion of a circuit board in a connector improper for that board be particularly effective. This is because, when each circuit board is tightened down into a connector by fasteners holding the crosspiece to the frame, the board is mechanically held in place independently of any mechanical retention of the board by the connector. In this way, a circuit board can be forced into a connector of an improper type for that circuit board if the mechanical means for preventing such insertion are not adequate. When a board is mechanically fastened to a frame as described, full engagement of the circuit board in a connector is not necessary to hold the board in place. Therefore, the mechanical keying or other means for preventing insertion of a circuit board into a connector of a type improper for that board must, in such a situation, prevent the insertion of an improper board even partially into a connector slot. In this way, conductive paths on the circuit board are prevented from making electrical contact within the slot of an improper connector.

It is the general aim of the invention, therefore, to provide a mainframe printed wiring board assembly for receiving plug-in circuit boards of at least two different types in connectors suitable for each respective type. It has been an objective of the invention to provide an improved mechanical keying arrangement for differentiating between at least two groups of connectors in a fashion that prevents placement of a circuit board edge in a connector improper for that circuit board, even when the board is urged into a connector with the application of considerable force.

These objectives have been achieved in accordance with the invention by providing key elements associated with the connectors to positively mechanically prevent the insertion of a circuit board into a connector of a type improper for the board. One form of the invention is characterized by the provision of a first elongated key element extending parallel to a first row of connectors for receiving a first type of circuit board, wherein the key element is placed at a first location relative to the row of connectors. A second elongated key element is provided extending parallel to a second row of connectors for receiving a second type of circuit board, the second key element being placed at a second location relative to the second row of connectors. The first and second relative locations of the key elements are different.

Each circuit board of the first type, suitable to be placed in the first row of connectors, is contoured along the edge of the board which engages the connector to accommodate the first elongated key element. Each board of the second type is differently contoured along its connector-engaging edge to accommodate the second key element.

For example, a circuit board of the first type contains a notch located along its connector-engaging edge in correspondence with the location of the first key element. When the board edge is inserted into the connector, the first key element is received in the slot, permitting the board to be fully inserted into the connector. A board of the second type contains a notch placed at a location to receive the second key element, which is different from the location of the first notch on a circuit board of the first type.

Therefore, if a circuit board of the second type is urged toward engagement in a connector in the first row of connectors, the first key element engages the board edge at an unnotched location. The first key element blocks the advance of the circuit board edge toward the connector when the key element engages the unnotched portion of the board edge. The height of the key element above the mainframe printed wiring board is sufficient to prevent even partial insertion of an entire row of conductive paths along the circuit board edge into the slot in the connector.

In one particular form of the invention, each connector further includes a conventional keying projection in the connector slot. Preferably, for each type of connector, the projection is located toward an end of the connector slot opposite the end of the slot which is nearest the key element for the connector. In this way the keying projection and the key element are spaced apart for each type of connector, providing two separate mechanical stops to prevent the insertion of a circuit board improper for the connector into the connector slot.

Other objects and advantages of the invention, and the manner of their implementation, will become apparent upon reading the following detailed description and upon reference to the drawings, in which:

FIG. 2 is a top plan view of the mainframe printed wiring board of FIG. 1 showing the connectors and key elements thereon;

FIG. 3 is a sectional view of one type of circuit board, connector and key element assembly taken along the line 3—3 in FIG. 1; and FIG. 4 is a cross sectional view of a second type of circuit board, connector and key element assembly taken along the line 4—4 in FIG. 1.

Figure 1:
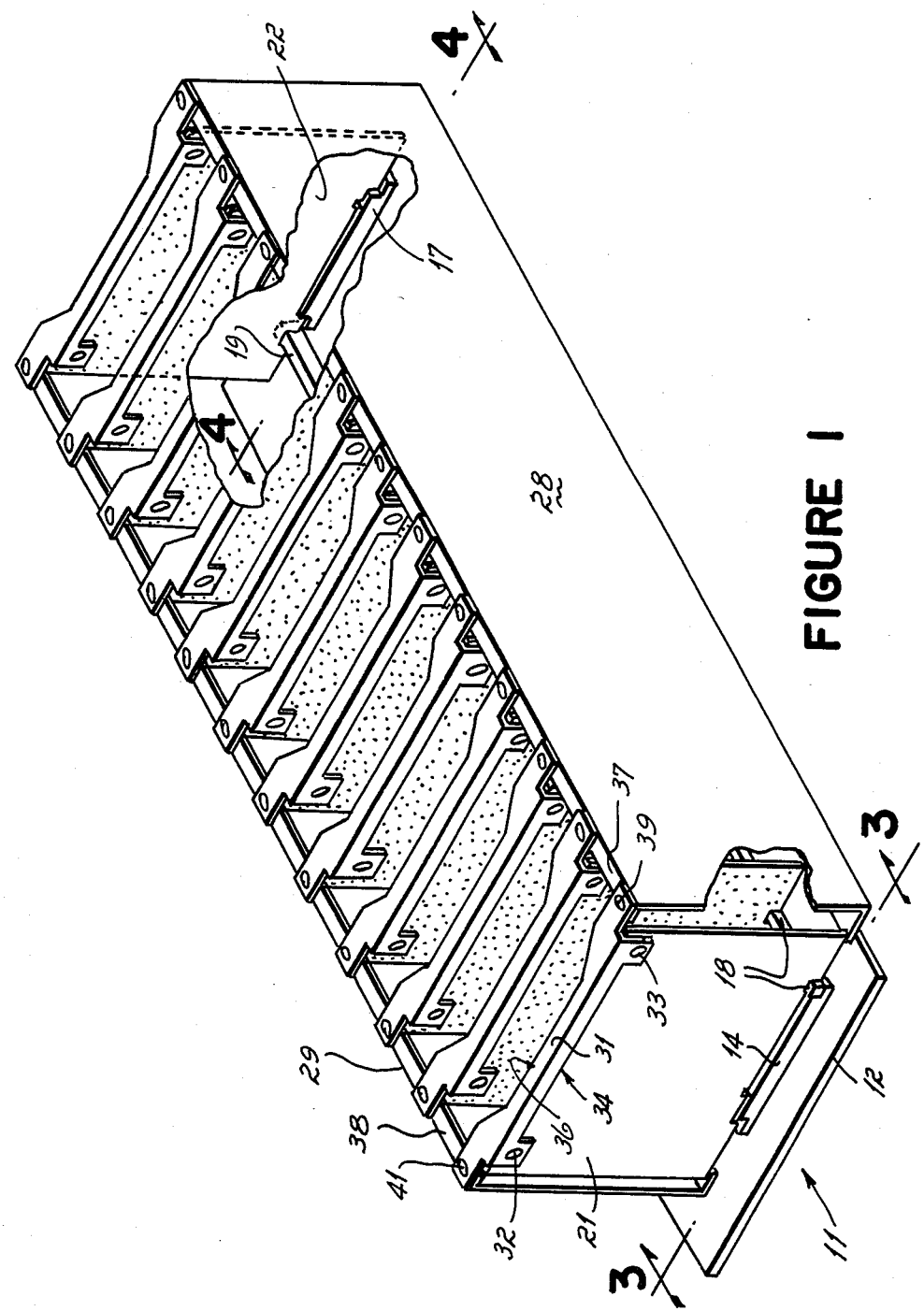
FIG. 1 is a perspective view of a mainframe printed wiring board and plug-in circuit board assembly in accordance with the present invention wherein portions of the assembly have been removed.

While this invention is susceptible to various modifications and alternative forms, a specific embodiment thereof has been shown by way of example in the drawings and will herein be described in detail. It should be understood, however, that it is not intended to limit the invention to the particular form disclosed, but, on the contrary, the intention is to cover all modifications, equivalents, and alternatives falling willing the spirit and scope of the invention as defined by the appended claims.

Turning now to the figures, a mainframe printed wiring board assembly 11 for receiving plug-in circuit boards of two different types includes a mainframe printed wiring board 12, a first row 13 of connectors 14 of a first type, a second row 16 of connectors 17 of a second type, a first elongated key element 18 associated with the first connector row 13, and a second elongated key element 19 associated with the second connector row 16. The mainframe printed wiring board 12 is typically a printed wiring board containing many conductive paths and/or circuit elements (not shown) for interconnecting electrical contacts 15, 20 in each of the connectors 14, 17. The mainframe printed wiring board 12 may carry additional electronic circuitry and may interface with other circuits in an electronic system by means of an interconnection element such as an edge connector (not shown) along an edge of the mainframe printed wiring board 12.

In the illustrated mainframe printed wiring board assembly 11, the connectors 14, 17 receive safety isolation circuit boards 21, 22, respectively. These isolation circuit boards interface between a robot control and a work-performing robot which is suited for operation in hazardous, for example flammable, environments such as for the application of volatile spray coatings to objects. Since the robot control includes circuitry which utilizes substantial voltages and currents, it is necessary to prevent coupling such substantial electrical energy to the work robot in the flammable environment in which it is operating. If such electrical energy were available at the robot work site, an arc or a short circuit could draw sufficient electrical current to cause an explosion or fire.

Consequently, the safety isolation circuit boards 21, 22 are provided to interface between the robot control circuitry and the controlled robot. The robot control circuitry is suitably coupled through the mainframe printed wiring board to certain of the contacts 15, 20 in the connectors 14, 17. In like manner the robot is electrically coupled to other contacts 15, 20 in the connectors 14, 17.

The particular isolation circuitry utilized on the isolation circuit boards 14, 17 to couple the robot to the robot control circuitry is not germane to the present invention and therefore shall not be described or illustrated herein. Each of the plug-in circuit boards 21, 22 includes a portion 23, 24 which is received in an associated connector 14, 17. The circuit board portions 23, 24 contain a number of discrete conductive paths such as 25, 30, respectively, leading to the circuitry on the circuit boards. These conductive paths in the connector-engaging edge portions 23, 24 make electrical connection to corresponding mating contacts 15, 20 in the slots 26, 27 of their respective connectors. The geometry of the conductive paths 25, 30, and the arrangement of mating contacts 15, 20 in the connectors, are not important to the invention; however, in the illustrated embodiment of the invention, each board edge and connector slot are adapted for 15 contacts. As shall be described, one of the contact locations has been replaced by a keying projection in each connector.

In the illustrated mainframe printed wiring board and circuit board arrangement, the plug-in circuit boards 21 are ac isolation circuit boards, and the circuit boards 22 are dc isolation circuit boards. The circuit boards 21 are used to isolate ac electrical power in the robot controller from those robot devices utilizing ac signals. The dc isolation circuit boards 22 isolate the dc power at the robot controller from the devices at the robot which utilize dc signals. Proper isolation between the control circuitry and the robot is obtained only when ac isolation boards 21 are inserted in the connectors 14 and when dc isolation circuit boards 22 are inserted in the dc connectors 17. An ac board in a dc connector, or a dc board in an ac connector, does not provide the requisite isolation between the robot control circuitry and the robot.

In the present mainframe printed wiring board and printed wiring board assembly, a rigid framework made up of a pair of metal frame panels 28, 29 is attached to the mainframe printed wiring board and extends upwardly therefrom on either side of the two rows 13, 16 of connectors. To hold the circuit boards in the connectors on the mainframe printed wiring board, each printed wiring board 21, 22 carries a metal crosspiece such as 31 on its upper edge, which is in turn fastened to the frame panels 28, 29.

Each crosspiece 31 is attached by a pair of screws 32, 33 to its associated printed wiring board such as 21. The crosspiece 31 has a first flat portion 34 lying along the underside of the circuit board. The portion 34 of the crosspiece is apertured at either end to receive the screws 32, 33 which fasten the crosspiece 31 to the circuit board. The crosspiece 31 further includes a second, elongated flat portion 36 at right angles to the first portion 34 which lies along the upper edge of the circuit board and extends laterally beyond the circuit board at either end to lie upon angled flanges 37, 38 of the frame panels 28, 29, respectively.

When a printed wiring board such as 21, with its associated crosspiece 31, is inserted in a proper connector 14 on the mainframe printed wiring board, the conductive pathbearing portion 23 of the circuit board may be fully inserted into the slot 26 of the connector 14. When the board is so inserted into the connector, the portion 35 of the crosspiece 31 rests at its ends upon the flanges 37, 38 of the framework panels. The circuit board 21 is secured in place by attaching the crosspiece 31 to the framework utilizing screws 39, 41. This positive attachment of the circuit boards in the connectors prevents accidental dislodgement of a circuit board during operation of the robot control system.

In the case of the particular assembly illlustrated, the mainframe printed wiring board 12 and attached frame panels 28, 29 are mounted as a unit in a control cabinet and the printed wiring boards 21, 22 are fastened therein.

Due to the mounting arrangement wherein the circuit board crosspieces 31 are secured to the frame panels 28 and 29, the circuit boards need not be fully inserted into the connectors in order to be physically supported on the main frame printed wiring board. Therefore, if a circuit board such as 22 can be partially inserted in an improper connector, such as 14, even though not fully inserted, the circuit board 22 would then be supported in place by the screws 39, 41 holding the board in the frame. Thus, even partial insertion of the conductive path-bearing portion of a board into an improper connector must be prevented.

In order to assure the placement of a printed wiring board in only a proper connector, two means of keying the boards and connectors are utilized. First, a conventional key projection is provided in each connector slot 26, 27; and, in addition, in accordance with the invention, the elongated key elements 18 and 19 are provided along the rows of connectors 13, 16, respectively.

With regard first to the circuit board 21 and its associated connector 14, the connector 14 includes a rigid projection 42 in the circuit board edge-receiving slot 26. The portion 23 of the board edge to be inserted in the connector slot 26 contains a cooperating notch 43 located to receive the projection 42 when the board 21 is inserted into the connector 14. Both the projection 42 and the notch 43 are located a distance "a" from an end of the connector slot. In like manner, each connector 17 contains a projection 44 in the slot 27 which is received in a cooperating notch 46 in a board 22 inserted into the connector. The notch 46 and the projection 44 are spaced a distance "b" from an end of the connector 17. As shown in FIGS. 3 and 4, the projection 42 on the connector 14 is at the left end of the connector, and the projection 44 on the connector 17 is at the right, or opposite, end of the connector. Therefore, for example, if a board 22 were urged into the connector 14, the projection 42 would contact the board edge portion 24 at an unnotched location, deterring insertion of the board. If the board 22 is turned over, so that the notch 46 is at the left rather than the right end of the board as illustrated in FIG. 4, and the board 22 urged into an improper connector 14, the notch 46 still does not coincide with the projection 42 since the spacings "a" and "b" are different.

The provision of keying projections in connector slots, and cooperative notches on circuit board edges, supplies a measure of protection against the insertion of a circuit board in a connector improper for that board. However, the keyed connector slot arrangement can be defeated. For example, a circuit board edge portion such as 24 may be forced into the slot 26 of the connector 14 through application of sufficient force, perhaps cracking or wearing away some of the edge portion 24 in the vicinity of the projection 42. In an arrangement such as the present one, in which the circuit boards are fastened into a frame, the circuit boards do not rely upon full insertion into a connector for physical support. Therefore, if electrical connection can be made between the conductors on the printed wiring board edge and the contacts in a connector improper for that circuit board, even with only partial insertion of the board into the connector slot, an improperly placed board may be utilized in the circuit. In the illustrated assembly, such improper insertion of a circuit board will defeat the safety isolation function of the circuit.

In accordance with the invention, therefore, means are provided to further positively prevent the insertion of a circuit board into a connector improper for that board. This is accomplished in the present instance by the provision of an elongated key element extending along each row of connectors of a given type. For example, with regard to the connectors 14 in the row 13, the elongated key element 18 is attached upon shoulders 47 at the ends of the connectors 14 in the row 13. The key element 18 extends upwardly slightly above the top 48 of the walls of the connector 14 which define the slot 26. An ac isolation printed wiring board 21 to be received in the connector 14 includes a cooperating wide notch 49 which receives the key element 18, permitting insertion of the board 21 into the connector 41.

In like fashion, the elongated key element 19 extends slightly spaced apart from the ends 51 of the row 16 of connectors 17 for dc isolation circuit boards 22. Each dc isolation circuit board 22 includes a cooperating wide notch 52, which receives the key element 19 to permit proper insertion of a board 22 into a connector 17.

It can be seen that the key element 19 is spaced apart from the left ends of the connector 17, and the key element 18 extends along the right ends of the connectors 14. Therefore, for example, if a circuit board such as 22 is urged into the connector 14, the key element 18, as well as the projection 42, engage the edge of the printed wiring board positively preventing even partial insertion of the board into the slot 26. The board 22 may, of course, be inverted, orienting the wide notch 52 at the right end of the circuit board. However, since the notch is spaced from the edge of the connector, it is, even with the circuit board inverted, not properly located to receive the key element 18, and insertion of the board 22 into the slot 26 of the connector 14 is prevented. In like manner, improper insertion of a circuit board such as 21 into a connector 17 is positively prevented through the action of the key element 19 and the projection 44 bearing against the edge of the board 21.

What is claimed is:

1. A mainframe printed wiring board assembly for receiving plug-in circuit boards of two different types in connectors correct for only one or the other type of circuit board, comprising:

a mainframe printed wiring board;

a first plurality of plug-in circuit board connectors mounted on the mainframe printed wiring board, each connector having a pair of elongated sidewalls and a pair of end walls defining an elongated slot having a principal direction and including means for establishing electrical connections to the mainframe printed wiring board from conductive paths on a plug-in circuit board inserted in the slot, the connectors in the first plurality of connectors being arranged in a row in a direction transverse to the principal direction of the slots in the connectors;

a second plurality of plug-in circuit board connectors mounted on the mainframe printed wiring board, each connector having a pair of elongated sidewalls and a pair of end walls defining an elongated slot having a principal direction and including means for establishing electrical connections to the mainframe printed wiring board from conductive paths on a plug-in circuit board inserted in the slot, the connectors in the second plurality of connectors being arranged in a row in a direction transverse to the principle direction of the slots in the connectors;

a first elongated key element extending parallel to the direction in which the row of connectors in the first plurality of connectors is arranged and positioned at a first location relative thereto; and a second elongated key element extending parallel to the direction in which the row of connectors in the second plurality of connectors is arrranged and positioned at a second location relative thereto, the positioning of the first key element relative to the first row of connectors differing from the positioning of the second key element relative to the second row of connectors, whereby a plug-in circuit board having an edge contoured to fit into the slot of a connector in one plurality of connectors and to accommodate its associated key element cannot be placed in the slot of a connector in the other plurality of connectors due to interference between said circuit board edge and the other key element.

2. The assembly of claim 1 in which the first elongated key element contacts the connectors in the first row of connectors, and the second elongated key element is spaced apart from the connectors in the second row of connectors.

3. The assembly of claim 2 in which each connector in the first and second pluralities of connectors includes an upwardly extending projection at a particular location along the slot, the projection being receivable in a notch in the edge of a circuit board to be inserted in the slot.

4. The assembly of claim 3 in which the projection in the slot of each connector is located toward an end of the connector slot opposite the end of the slot which is nearest the key element associated with the connector.

5. The assembly of claim 4 in which the row of first connectors and the row of second connectors are arranged in a common row.

6. The assembly of claim 5 in which the walls of each connector in the first and second pluralities of connectors extend upwardly from the mainframe printed wiring board a particular distance, and the first and second elongated key elements extend upwardly from the mainframe printed wiring board a greater distance than the connector walls.

7. The assembly of claim 1 in which the walls of each connector in the first and second pluralities of connectors extend upwardly from the mainframe printed wiring board a particular distance, and the first and second elongated key elements extend upwardly from the mainframe printed wiring board a greater distance than the connector walls.

8. A mainframe printed wiring board and plug-in circuit board assembly wherein plug-in circuit boards of two different types are received in connectors on the mainframe printed wiring board correct for only one or the other type of circuit board, comprising:

a mainframe printed wiring board;

a first plurality of plug-in circuit board connectors mounted on the mainframe printed wiring board, each connector having a pair of elongated sidewalls and a pair of end walls defining an elongated slot having a principal direction and including means for establishing electrical connections to the mainframe printed wiring board from conductive paths on a plug-in circuit board inserted in the slot, the connectors in the first plurality of connectors being arranged in a row in a direction transverse to the principal direction of the slots in the connectors;

a second plurality of plug-in circuit board connectors mounted on the mainframe printed wiring board, each connector having a pair of elongated sidewalls and a pair of end walls defining an elongated slot having a principal direction and including means for establishing electrical connections to the mainframe printed wiring board from conductive paths on a plug-in circuit board inserted in the slot, the connectors in the second plurality of connectors being arranged in the same row as the connectors in the first plurality of connectors, in the direction transverse to the principal direction of the slots;

a first elongated key element extending parallel to the direction in which the row of connectors in the first plurality of connectors is arranged and positioned at a first location relative thereto; and a second elongated key element extending parallel to the direction in which the row of connectors in the second plurality of connectors is arranged and positioned at a second location relative thereto, the positioning of the first key element relative to the first row of connectors differing from the positioning of the second key element relative to the second row of connectors, whereby a plug-in circuit board having an edge contoured to fit into the slot of a connector in one plurality of connectors and to accommodate its associated key element cannot be placed in the slot of a connector in the other plurality of connectors due to interference between said circuit board edge and the other key element;

a first plurality of plug-in circuit boards, each circuit board having an edge, a portion of which is received in the slot of an associated connector in said first plurality of connectors, each said edge further including a recessed portion receiving the first elongated key element; and a second plurality of plug-in circuit boards, each circuit board having an edge, a portion of which is received in the slot of an associated connector in said second plurality of connectors, each said edge further including a recessed portion receiving the second elongated key element.

9. The assembly of claim 8 in which the first elongated key element contacts the connectors in the first row of connectors and the second elongated key element is spaced apart from the connectors in the second row of connectors.

10. The assembly of claim 9 in which each connector in the first plurality of connectors includes an upwardly extending projection at a first location along the slot, and each connector in the second plurality of connectors includes an upwardly extending projection at a second location along the slot, each plug-in circuit board of the first plurality of plug-in circuit boards having a notch in its connector-engaging edge located to receive the projection in a slot in a connector of the first plurality of connectors and each plug-in circuit board of the second plurality of plug-in circuit boards having a notch along its slot-engaging edge located to receive the projection in a slot of a connector in the second plurality of connectors.

11. The assembly of claim 10 in which the projection in the slot of each connector is located toward an end of the connector slot opposite the end of the slot which is nearest the key element with the connector.

12. The assembly of claim 11 in which the walls of each connector in the first and second pluralities of connectors extend upwardly from the mainframe printed wiring board a particular distance, and the first and second elongated key elements extend upwardly from the mainframe printed wiring board a greater distance than the connector walls.

13. The assembly of claim 8 in which the walls of each connector in the first and second pluralities of connectors extend upwardly from the mainframe printed wiring board a particular distance, and the first and second elongated key elements extend upwardly from the mainframe printed wiring board a greater distance than the connector walls.

14. A mainframe printed wiring board and plug-in circuit board assembly wherein plug-in circuit boards of two different types are received in connectors on the mainframe printed wiring board correct for only one or the other type of circuit board, comprising:

a mainframe printed wiring board;

a first plurality of plug-in circuit board connectors mounted on the mainframe printed wiring board, each connector having a pair of elongated sidewalls and a pair of end walls defining an elongated slot having a principal direction and including means for establishing electrical connections to the mainframe printed wiring board from conductive paths on a plug-in circuit board inserted in the slot, the connectors in the first plurality of connectors being arranged in a row in a direction transverse to the principal direction of the slots in the connectors;

a second plurality of plug-in circuit board connectors mounted on the mainframe printed wiring board, each connector having a pair of elongated sidewalls and a pair of end walls defining an elongated slot having a principal direction and including means for establishing electrical connections to the mainframe printed wiring board from conductive paths on a plug-in circuit board inserted in the slot, the connectors in the second plurality of connectors being arranged in the same row as the connectors in the first plurality of connectors, in a direction transverse to the principal direction of the slots in the connectors;

a first elongated key element extending parallel to the direction in which the row of connectors in the first plurality of connectors is arranged and positioned at a first location relative thereto; and a second elongated key element extending parallel to the direction in which the row of connectors in the second plurality of connectors in arranged and positioned at a second location relative thereto, the positioning of the first key element relative to the first row of connectors differing from the positioning of the second key element relative to the second row of connectors, whereby a plug-in circuit board having an edge contoured to fit into the slot of a connector in one plurality of connectors slot and the accommodate its associated key element cannot be placed in the slot of a connector in the other plurality of connectors due to interference between said circuit board edge and the other key element;

a first plurality of plug-in circuit boards, each circuit board having an edge, a portion of which is received in the slot of an associated connector in said first plurality of connectors, each said edge further including a recessed portion receiving the first elongated key element;

a second plurality of plug-in circuit boards, each circuit board having an edge, a portion of which is received in the slot of an associated connector in said second plurality of connectors, each said edge further including a recessed portion receiving the second elongated key element;

a pair of upwardly extending rigid frame walls attached to the mainframe printed wiring board along either side of the row of connectors;

a plurality of rigid crosspieces, a different one of which is rigidly attached to each circuit board of said pluralities of circuit boards on an edge opposite to the circuit board edge which is received in a connector slot; and means for attaching each said crosspiece to the pair of frame walls when each circuit board is received in a connector slot.

15. The assembly of claim 14 in which the first elongated key element contacts the connectors in the first row of connectors and the second elongated key element is spaced apart from the connectors in the second row of connectors.

16. The assembly of claim 15 in which each connector in the first plurality of connectors includes an upwardly extending projection at a first location along the slot, and each connector in the second plurality of connectors includes an upwardly extending projection at a second location along the slot, each plug-in circuit board of the first plurality of plug-in circuit boards having a notch in its connector-engaging edge located to receive the projection in a slot in a connector of the first plurality of connectors and each plug-in circuit board of the second plurality of plug-in circuit boards having a notch along its slot-engaging edge located to receive the projection in a slot of a connector in the second plurality of connectors.

17. The assembly of claim 16 in which the projection in the slot of each connector is located toward an end of the connector slot opposite the end of the slot which is nearest the key element associated with the connector.

18. The assembly of claim 17 in which the walls of each connector in the first and second pluralities of connectors extend upwardly from the mainframe printed wiring board a particular distance, and the first and second elongated key elements extend upwardly from the mainframe printed wiring board a greater distance than the connector walls.

19. The assembly of claim 14 in which the walls of each connector in the first and second pluralities of connectors extend upwardly from the mainframe printed wiring board a particular distance, and the first and second elongated key elements extend upwardly from the mainframe printed wiring board a greater distance than the connector walls.

* * * * *

UNITED STATES PATENT AND TRADEMARK OFFICE
CERTIFICATE OF CORRECTION

PATENT NO. : 4,546,414
DATED : October 8, 1985
INVENTOR(S) : William E. Donges

It is certified that error appears in the above-identified patent and that said Letters Patent is hereby corrected as shown below:

```
Column 2,  line 38, "connected" should be --enclosed--.

Column 3,  line 64, "separate" should be --separated--.

Column 4,  line 16, "this" should be --the--.

Column 4,  line 23, "willing" should be --falling--.

Column 5,  line 64, "35" should be --36--.

Column 7,  line 20, "41" should be --14--.

Column 10, line 6,  after "element", insert --associated--.

Column 10, line 58, "in" should be --is--.

Column 10, line 66, "the" should be --to--.
```

Signed and Sealed this

Sixth Day of May 1986

[SEAL]

Attest:

Attesting Officer

DONALD J. QUIGG

Commissioner of Patents and Trademarks